United States Patent

Slizynski et al.

[11] Patent Number: 6,057,679
[45] Date of Patent: May 2, 2000

[54] INTEGRATED CIRCUIT TESTER HAVING AMORPHOUS LOGIC FOR REAL-TIME DATA ANALYSIS

[75] Inventors: Roman A. Slizynski, Beaverton; Bryan J. Dinteman, Canby, both of Oreg.

[73] Assignee: Credence Systems Corporation, Fremont, Calif.

[21] Appl. No.: 09/096,812

[22] Filed: Jun. 12, 1998

[51] Int. Cl.$^7$ .................................................. G01R 31/28
[52] U.S. Cl. ........................................ 324/158.1; 714/724
[58] Field of Search ............................... 324/158.1, 73.1, 324/765; 714/724, 725

[56] References Cited

U.S. PATENT DOCUMENTS

| | | | |
|---|---|---|---|
| 4,242,751 | 12/1980 | Henckels et al. | 324/158.1 |
| 4,709,366 | 11/1987 | Scott et al. | 324/73.1 |
| 5,235,271 | 8/1993 | Kira | 714/734 |
| 5,581,491 | 12/1996 | Biwer et al. | 324/73.1 |

*Primary Examiner*—Ernest Karlsen
*Attorney, Agent, or Firm*—Smith-Hill and Bedell

[57] ABSTRACT

A general purpose integrated circuit (IC) tester includes a set of channels, one for each input or output pin of an IC device under test (DUT). Each channel is programmed by a host computer to either supply a test signal to a DUT I/O pin or sample a DUT output signal appearing at the I/O pin and produce sample data representing its magnitude or logic state. The tester also includes an amorphous logic circuit (ALC) having a set of input and output terminals and a programmable logic circuit interconnecting the input and output terminals. Some of the ALC input and output terminals receive the sample data produced by each channel and other ALC terminals send control signals directly to each channel. Other ALC terminals transmit data to the host computer. When it programs the channels to perform a test, the host computer also programs the ALC to control various operations of the channels during the test, to perform a real-time analysis of the test data produced by the channels, and to communicate results of the analysis to the host.

18 Claims, 2 Drawing Sheets

6,057,679

INTEGRATED CIRCUIT TESTER HAVING AMORPHOUS LOGIC FOR REAL-TIME DATA ANALYSIS

BACKGROUND OF THE INVENTION

1. Field of the Invention

The present invention relates in general to integrated circuit (IC) testers and in particular to an IC tester having amorphous logic for real-time analysis of acquired test data.

2. Description of Related Art

A typical "per-pin" general purpose integrated circuit (IC) tester includes a set of channels, one for each pin of an IC device under test (DUT). At various times during a test each channel may either send a test signal to a DUT pin or sample a DUT output signal to produce sample data representing the state or magnitude of the DUT output signal. A host computer separately programs each channel to tell it what to do during the test and when to do it. The host computer then sends a START signal concurrently to all channels to tell them to start the test. During the test all channels operate independently, but they each time their test activities with reference to a master clock signal so that test activities at all DUT pins are synchronized.

It is preferable to use a tester that can analyze data acquired by the channels in real time as it is being acquired. In doing so, the tester can immediately halt the test when it determines that a DUT is defective. This frees the tester to test another IC sooner than if the tester had to complete the full test on the DUT before analyzing any of the sample data. In some testers each channel sampling a DUT output signal compares each sample data value it produces to a value that would be expected if the DUT were operating properly. If the sample data value does not match its expected value, the channel signals the host computer that the DUT has failed the test. The host computer can then signal the other channels to halt the test, log the DUT as having failed the test, signal DUT handling equipment to move a next DUT to be tested into position in the tester, and then signal the channels to start a new test. When the DUT passes a test, one of the channels, or some central resource, signals the host computer that the test is complete.

Some tests call for a more complicated analysis of acquired sample data. For example when we test an A/D converter producing a sequence of N-bit digital output words representing the time varying magnitude of an input analog test signal, we may want a host computer to perform a discrete Fourier analysis on the A/D converter output sequence to determine its frequency components. Some special purpose testers can perform complicated data analysis in real time because they have dedicated hardware logic for quickly analyzing the acquired data and have direct paths from each channel for quickly delivering the acquired data to the that dedicated hardware logic in real time. However in a general purpose IC tester there is no central dedicated hardware logic for analyzing the acquired test data. A host computer can be programmed to analyze the acquired data, but a host computer can't acquire and analyze the data in real time, particularly if the data is being generated quickly. A host computer is too slow to perform the analysis in real time. Also the host computer typically communicates with the channels through a single parallel bus, and such a restricted data path would not allow the host to acquire a large amount of test data from the channels in real time. Since the host computer cannot access and analyze the channels' sample data in real time, each channel simply stores its acquired sample data in a local acquisition memory during the test. The host computer then reads and analyzes the data in the channels' acquisition memories when the test is complete.

What is needed is a general purpose IC tester that can obtain test data from the channels as the channels acquire it and which can be programmed to perform real-time analysis on that sample data.

SUMMARY OF THE INVENTION

A general purpose integrated circuit (IC) tester in accordance with the present invention includes a set of channels, one for each input or output pin or terminal of an IC device under test (DUT). Each channel may either supply a test signal to a DUT pin or sample a DUT output signal appearing at the pin to produce sample data representing its magnitude or logic state. Before the start of a test, a host computer transmits programming data to the channels via a conventional computer bus to tell them how to control their output test signals and when to sample the output signals.

The IC tester also includes a conventional amorphous logic circuit (ALC) of the type having a set of input and output terminals and a programmable logic circuit interconnecting the input and output terminals. The logic circuit may be programmed to process input data appearing at the ALC input terminals in any of a variety of ways to produce output data at the ALC output terminals. Some of the ALC input and output terminals are connected to the tester channels so that the ALC may receive sample data directly from each channel and so that the ALC can send control signals directly to each channel. Other ALC terminals are connected to a computer bus interface to allow the host computer to communicate with the ALC.

When it programs the channels to perform a test, the host computer may also program the ALC to obtain and analyze the test data as the channels produce it, to control various operations of the channels during the test, and to communicate with the host, for example, to indicate when the test is complete and to provide test results.

It is accordingly an object of the invention to provide a programmable general purpose IC tester that can acquire and flexibly analyze IC output data in real time.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 1 illustrates in block diagram form a general purpose integrated circuit (IC) tester in accordance with the present invention for testing an IC device under test (DUT), FIG. 2 illustrates an analog tester channel of FIG. 1 in more detailed block diagram form, and FIG. 3 illustrates a digital tester channel of FIG. 1 in more detailed block diagram form.

DESCRIPTION OF THE PREFERRED EMBODIMENT(S)

Figure 1:
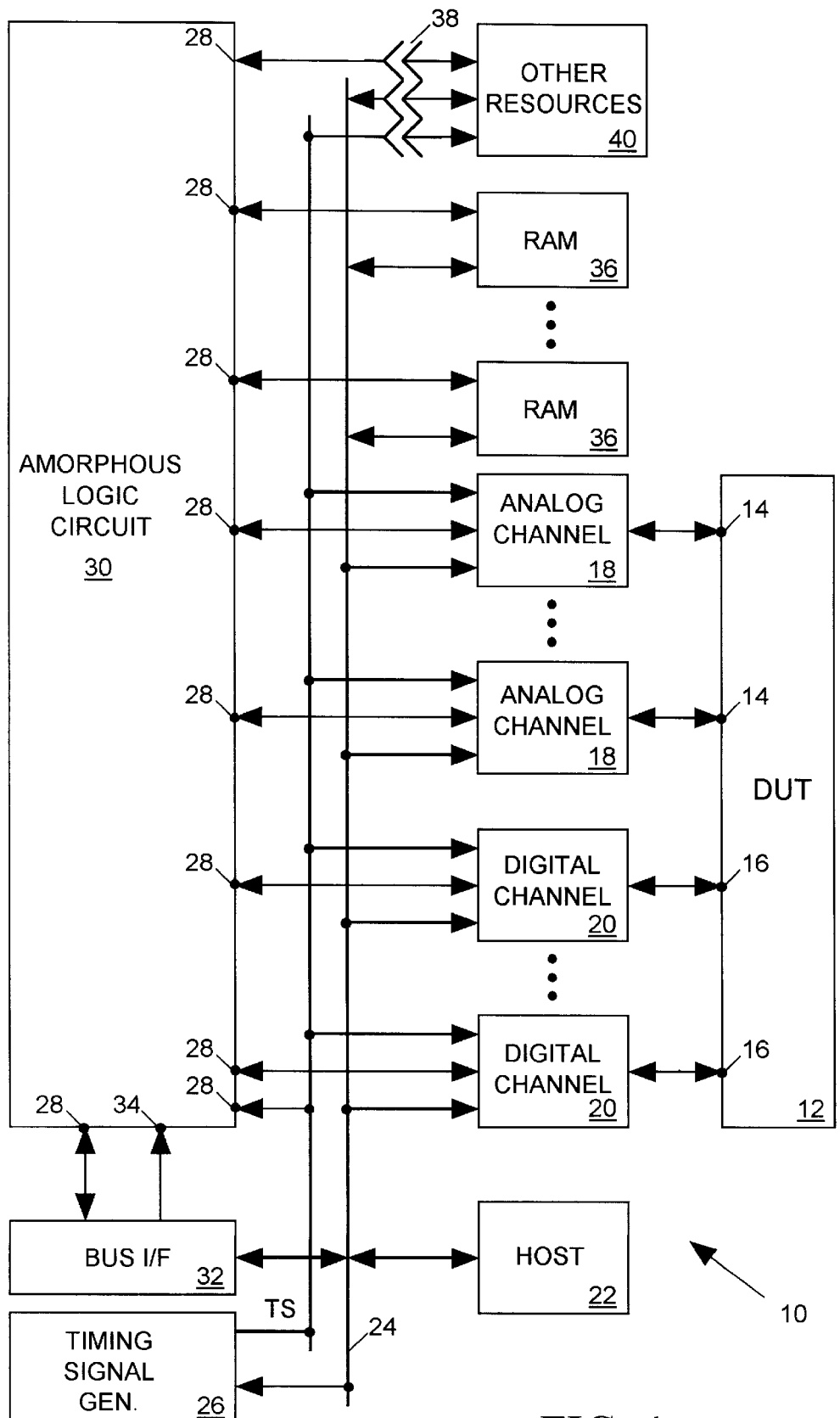

FIG. 1 illustrates in block diagram form a general purpose integrated circuit (IC) tester 10 in accordance with the present invention for testing an IC device under test (DUT) 12. DUT 12 may have analog input/output (I/O) terminals 14 or digital I/O terminals 16. Tester 10 includes at least one analog channel 18 for each DUT analog I/O terminal 14 and at least one digital channel 20 for each DUT digital I/O terminal 16. During a test each analog channel 18 may send a time-varying analog test signal to a corresponding analog terminal 14 of DUT 12. Each analog channel may also digitize an analog output signal produced at the terminal 14 by DUT 12 to produce an output waveform data sequence representing the time-varying behavior of the DUT output signal. Similarly, each digital channel 20 may send a time-varying digital test signal to a corresponding digital terminal 16 and/or may repetitively sample a DUT 12 digital output signal produced at that terminal 16 to determine its logic state and to produce a data sequence representing the time-varying behavior of the DUT output signal.

A host computer 22 sends programming data to channels 18 and 20 via a conventional parallel computer bus 24 before the start of a test to tell the channels what to do during the test. A timing signal generator 26 supplies a set of periodic timing signals TS to channels 18 and 20 during the test, and channels 18 and 20 use timing signals TS as references when timing their test activities. Host computer 22 sets the frequency of timing signals TS before the start of the test by supplying programming data to timing signal generator 26 via bus 24.

Each of channels 18 and 20 is connected to I/O terminals 28 of a conventional amorphous logic circuit (ALC) 30 such as, for example, a programmable gate array. ALC 30 has a set of I/O terminals 28 and an internal array of logic gates interconnecting its I/O terminals 28. The logic gate array receives digital input data and signals at those I/O terminals 28 that act as input terminals and produces in logical response thereto output data at I/O terminals 28 that act as output terminals. Before a test starts, host computer 22 sends data to a programming terminal 34 of ALC 30 to configure its internal logic gate array so as to establish a desired logical relationship between the ALC 30 input and output data. Each channel 18 and 20 supplies its data sequence as ALC input data to a set of I/O terminals 28 of ALC 30. The timing signals TS are also provided as input data to other ALC terminals 28. A bus interface circuit 32 forwards output data produced at some ALC terminals 28 to host computer 22 via bus 24.

Tester 10 also includes a set of random access memories (RAMs) 36 that may be read or write accessed either via host computer 22 via bus 24 and/or by ALC 30 via some of its I/O terminals 28. A set of connectors 38 may link various ALC I/O terminals 28 to other resources 40 that may be plugged into connectors 38. Connectors 38 also link resources 40 to bus 24 and deliver timing signals TS to resources 40. Other resources 40 that may be plugged into connectors 38 may include, for example, additional memory or high-speed signal processing devices such as additional amorphous logic circuits, programmable and dedicated purpose digital filters, digital pattern generators, counters and hardware logic circuits, etc. Such high speed signal processing devices can assist amorphous logic circuit 30 in carrying out real-time processing of acquired test data. One or more software programmable devices such as programmable computers also be plugged into connectors 38 when they are needed for processing acquired test data other than in real time.

When it programs channels 18 and 20 before starting a test, host computer 22 also sends programming data to terminals 34 of ALC 30 via bus 24 and bus interface 32. That programming data programs ALC 30 to logically process input data arriving at various I/O terminals 28 to produce output data at other I/O terminals 28. Host computer 22 may also write data to various addresses of RAMs 36 and may provide programming data to any programmable resources 40 connected to bus 24 via connectors 38.

After programming tester 10 to perform a test, host computer sends a START command to bus interface 32 via bus 24. Bus interface 32 responds by sending a start signal pulse to an I/O terminal 28 of ALC 30. ALC 30 may be programmed to respond to the start signal by forwarding it to all channels 18 and 20. Channels 18 and 20 respond to the start signal by carrying out their programmed test activities, with test activities of all channels being synchronized to timing signals TS. During the test, the analog or digital channels 18 and 20 that sample DUT 12 output signals may send the waveform data sequences they produce to terminals 28 of ALC 30. ALC 30 may be programmed to analyze the waveform data sequences as it receives them to determine characteristics of the DUT output signals and to thereafter send output data to host 22 via bus interface 32 and bus 24 reporting the result of its analysis. During the test, ALC 30 may also respond to input data from channels 18 and 20 by transmitting control signals to them to direct the course of their activities. During the test ALC 30 may read and write access RAMs 36 and may make use of resources 40 when analyzing the waveform data sequences.

The architecture of tester 10 provides great flexibility in the manner in which it acquires and processes test data and in the manner it responds to the test data. Suppose, for example, that DUT 12 is an 8-bit analog-to-digital converter for digitizing an analog waveform provided to one of its analog input terminals 14 to produce a sequence of 8-bit output data words at eight of its digital output terminals 16. We can test the behavior of DUT 12 by using one of analog channels 18 to send an analog waveform to its analog input terminal 14 and using eight of its digital channels 20 to periodically sample the DUT output data bits appearing at its eight digital output terminals to produce a waveform data sequence. ALC 30 can be programmed, for example, to perform discrete Fourier analysis on the waveform data sequence, to determine its frequency components.

The analog channel 18 producing the analog test signal input to DUT 12 includes a digital-to-analog converter for converting an input waveform data sequence supplied by ALC 30 into the analog test signal. Host computer 22 can program tester 10 to produce that waveform data sequence in several ways. It could, for example, program some of the internal logic of ALC 30 to directly generate the data sequence. Host computer 22 could also preload the data sequence into one of RAMs 36 before the test and program ALC 30 to read that data sequence out of the RAM and send it to the analog channel during the test. Or if a programmable pattern generator is plugged into connectors 38, host computer 22 may program that pattern generator to generate the waveform data sequence and program ALC 30 to forward that sequence to the appropriate analog channel 18.

The digital channels 20 that acquire the DUT 12 output waveform data sequence send each 8-bit word of that data sequence to ALC 30 as they acquire it. Host computer 22 can program ALC 30 to process the DUT output data sequence in several ways. If real-time analysis is not necessary, host 22 could program ALC 30 to simply write the data sequence to one or more of RAMs 36. After the test has ended, the host computer can read that data sequence out of RAMs 36 and perform the necessary analysis. If real-time data analysis is needed, host computer 22 could program ALC 30 to directly perform the Fourier analysis on the data as it arrives from digital channels 20 and to store results of its analysis in RAMs 36 for subsequent delivery to the host after the test is complete. If a digital filter or other resource 40 capable of carrying out a part or all of the Fourier analysis is plugged into socket 38, host computer 22 may program ALC 30 to forward input data to the resource 40 and to receive and further process the resource's output data.

Host computer 22 could program tester 10 to test a digital-to-analog converter in an analogous manner by programming a set of digital channels 20 to send a digital data sequence to DUT 12, using a digitizer in one of analog channels 18 to digitize the DUT's analog output signal, and programming ALC 30 to analyze the waveform data sequence produced by the analog channel 18.

Since the analysis of the DUT output waveform data may be performed by relatively the fast hardware logic of amorphous logic circuit 30 or various other resources 40, rather than by the relatively slow host computer 22, the analysis can be performed in real time as the data is acquired, rather than at a much slower rate after the test is complete. When a test involves both real-time and "non-real-time" processing of acquired data, the tester architecture allows flexible interactions between real-time and non-real-time processing equipment. During the test the real-time portions of the data processing task can be carried out by the amorphous logic circuit 30 or other high speed hardware logic resources 40. The non-real-time portions of the task can be performed later by host computer 22 or by computers or by other relatively slow data processing resources accessed via connectors 38. This frees the tester to begin testing another device.

Since amorphous logic circuits such as programmable logic arrays and programmable gate arrays and the manner in which they may be programmed for use in a wide variety of digital signal processing applications are well-known to those skilled in the art, ALC 30 of FIG. 1 is not further detailed herein. Host computer 22, timing signal generator 26, bus interface circuit 32, and RAMS 36 and resources 40, such as programmable computers, programmable and dedicated purpose digital filters, digital pattern generators, counters and hardware logic circuits, are also well-known to those skilled in the art and are not further detailed herein.

Figure 2:
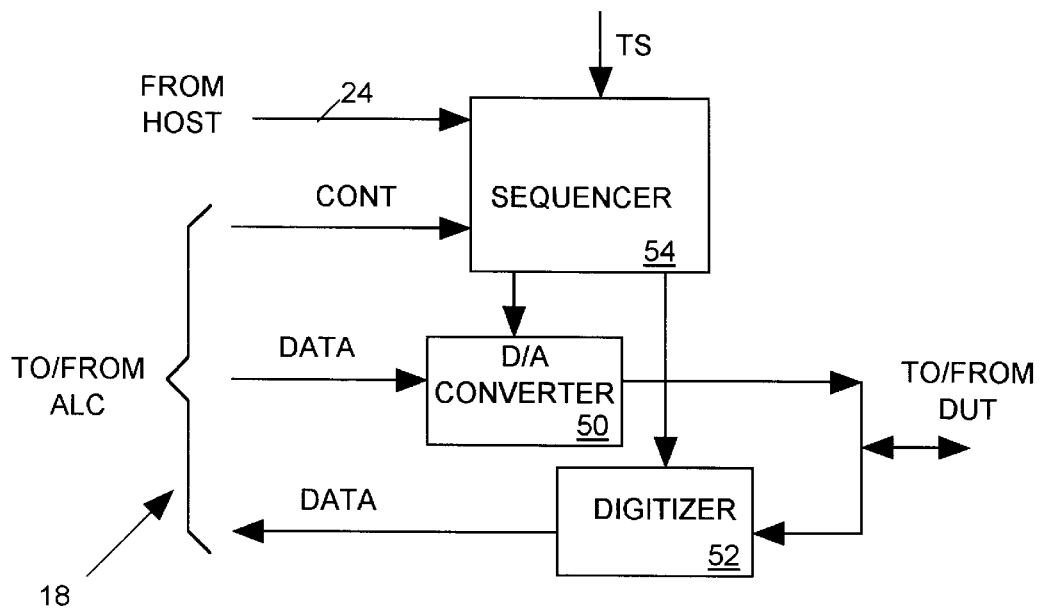

FIG. 2 illustrates an analog tester channel 18 of FIG. 1 in block diagram form. Analog channel 18 includes a digital-to-analog converter (DAC) 50 and a digitizer 52 each controlled by a sequencer 54. DAC 50 responds to input waveform data from ALC 30 of FIG. 1 by producing an output analog signal of magnitude controlled by the value of its input data. Sequencer 54 transmits control signals to DAC 50 telling it when to acquire input data from ALC 30 of FIG. 1, when to drive the DUT input terminal, and when to tristate its output signal. Digitizer 52 responds to a control signal pulse from sequencer 54 by sampling the DUT output signal and sending a data value representing the magnitude of the DUT output signal to ALC 30 of FIG. 1. Sequencer 54, programmed by data from host 22 via bus 24, times its output control signals with reference to the TS timing signals. Control signals from ALC 30 of FIG. 1 tell sequencer 54 when to start, stop or branch its programmed sequence of operations. Since programmable sequencers, D/A converters and digitizers are well-known in the art, devices 50, 52 and 54 are not further detailed herein.

Figure 3:
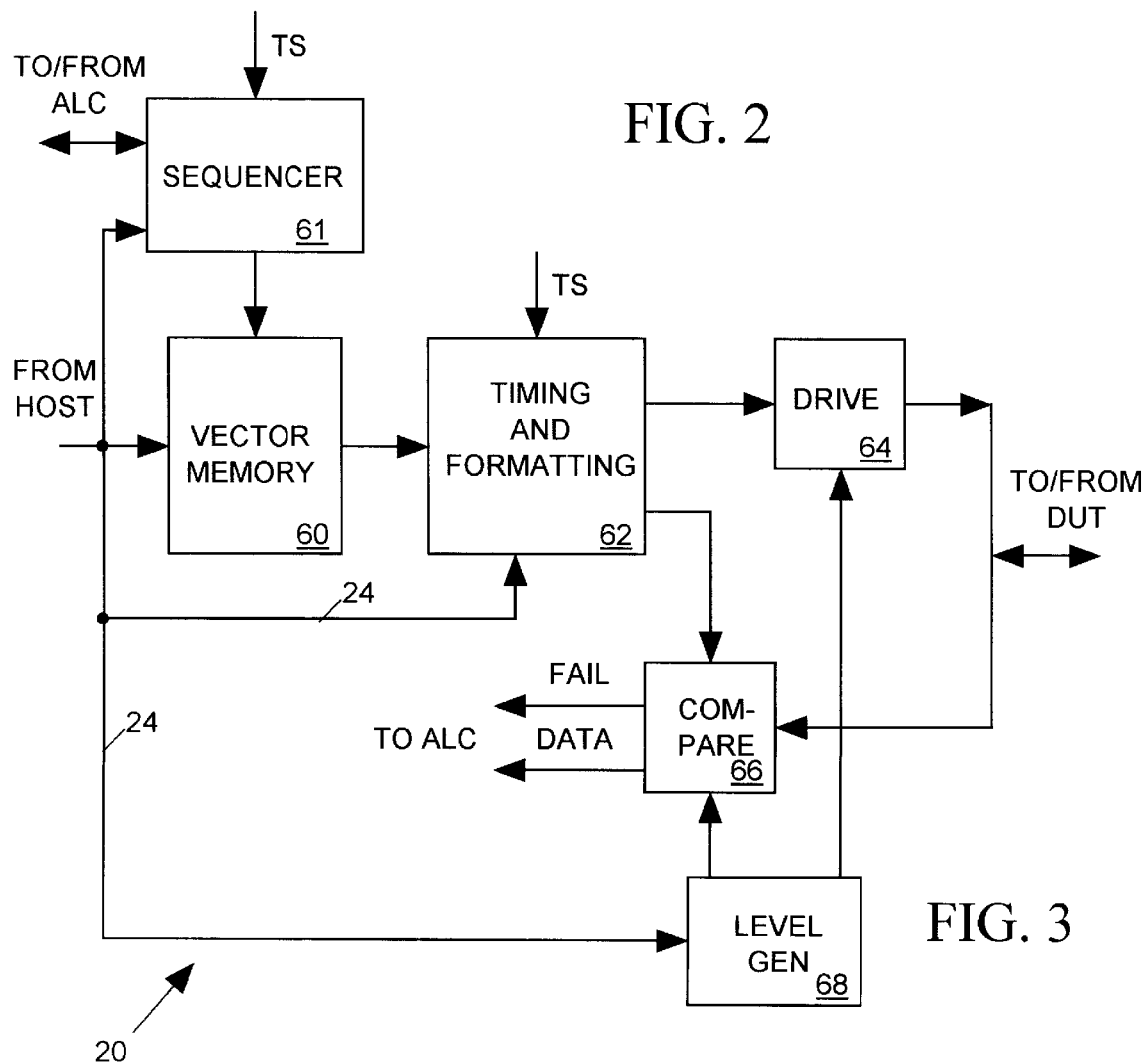

FIG. 3 illustrates a digital tester channel 20 of FIG. 1 in block diagram form. Tester channel 20 includes a vector memory 60 for storing a vector data sequence from host computer 22 of FIG. 1 via bus 24. A test is organized into a succession of test cycles, and each "vector" of the vector data sequence is a data word indicating an action or set of actions that the channel is to carry out during a test cycle. At the start of a test, ALC 30 of FIG. 1 transmits a start signal to a sequencer 61 telling it to begin read addressing vector memory 60 in response to one of timing signals TS indicating the start of each test cycle. In response to each input address from sequencer 61, vector memory 60 reads out the vector for the next test cycle to a timing and formatting circuit 62. Timing and formatting circuit 62 decodes the vector in a manner determined by input programming data from host computer 22 (FIG. 1) provided before the start of the test to produce control signal inputs to a drive circuit 64 and/or to a compare circuit 66.

Drive circuit 64 generates the test signal input to the DUT. The vector input to timing and formatting circuit 62 tells it when during a test cycle it is to signal drive circuit 64 to change the state of its output test signal. That test signal may be either logically high, logically low or tristated.

Compare circuit 66 samples the DUT output signal to determine its state. The vector input to timing and formatting circuit 62 also tells it when during a test cycle it is to signal compare circuit 66 to sample the DUT output signal. In one mode of operation, timing and formatting circuit 62 supplies "expect" data to compare circuit 66 indicating expected logic states of the DUT output signal for each test cycle. When compare circuit 66 determines that the DUT output signal is not of the expected state, it asserts a FAIL signal input to ALC 30 of FIG. 1. In another mode of operation compare circuit 66 simply samples the DUT output data state, sends a data bit indicating the sampled signal state directly to ALC 30, and asserts the FAIL signal if the DUT output signal state is neither high nor low. A level generator 68 programmed by data from host computer 22 of FIG. 1, supplies reference voltage signals to drive circuit 64 and compare circuit 66 indicating the high and low logic levels.

ALC 30 of FIG. 1 supplies control signals to sequencer 61 that can cause it to start, branch or stop its operation, and sequencer 61 may be programmed to send control signals back to ALC 30 to indicate when it has reached the end of a test.

The components 60, 61, 62, 64 and 68 of the digital channel 20 of FIG. 3 are well-known to those skilled in the art and are not further detailed herein.

Thus has been shown and described an integrated circuit tester that employs amorphous logic for performing real-time data analysis of waveform data representing the behavior of DUT output signals. While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An integrated circuit (IC) tester for performing a test on an IC device under test (DUT), the DUT having a plurality of DUT input and output terminals, said DUT producing DUT output signals at said DUT output terminals in response to DUT input signal received at said DUT input terminals, the IC tester comprising:

a plurality of first tester channels, each being connected to a corresponding one of said DUT input terminals, and being programmed by input first programming data to supply a time-varying test signal to the corresponding DUT input terminal during said test;

a plurality of second tester channels, each being connected to a corresponding one of said DUT output terminals and being programmed by input second programming data to produce a data sequence representing a time-varying behavior of a DUT output signal transmitted from the corresponding DUT output terminal; and an amorphous logic circuit (ALC) having a plurality of ALC input terminals, a plurality of ALC output terminals, and a plurality of logic gates interconnected between said ALC input terminals and ALC output terminals in a manner determined by input third programming data, said logic gates receiving said ALC input data and producing said ALC output data in logical response to said ALC input data in accordance with the manner in which they are interconnected, wherein said ALC input terminals receive the data sequence produced by each of said second channels as ALC input data, and wherein said ALC produces ALC output data at said ALC output terminals in logical response to the sample data sequences supplied to its input terminals.

2. The IC tester in accordance with claim 1 further comprising:

a computer for producing said first, second and third programming data as output prior to said test, and bus means for conveying said first programming data to said first tester channels, said second programming data to said second tester channels, and said third programming data to said ALC.

3. The IC tester in accordance with claim 2 wherein said bus means also conveys at least a portion of said ALC output data to said computer.

4. The IC tester in accordance with claim 1 wherein said ALC output data represents a characteristic of said at least one DUT output signal.

5. The IC tester in accordance with claim 1 further comprising memory means connected to ones of said ALC output and input terminals for receiving and storing ALC output data provided at said ALC output terminals and for reading out stored data and providing it as ALC input data at said ALC input terminals.

6. The IC tester in accordance with claim 1 further comprising:

hardware data processing means for receiving and processing ALC output data to produce ALC input data, and connector means for receiving and holding said hardware data processing means, for connecting said hardware data processing means to ones of said ALC input and output terminals and for delivering ALC output data from said ALC to said hardware data processing means and for delivering ALC input data from said hardware data processing means to said ALC.

7. The IC tester in accordance with claim 1 further comprising:

data generating means for generating a data sequence, and connector means for receiving and holding said data generating means, for connecting said data generating means to ones of said ALC input terminals and for delivering said data sequence as ALC input data to said ALC.

8. The IC tester in accordance with claim 1 wherein each of said first and second tester channels is also connected to at least one of said ALC output terminals for receiving ALC output data, and wherein the output data received by each of said first and second tester channel controls operations thereof.

9. An integrated circuit (IC) tester for performing a test on an IC device under test (DUT), the DUT having a plurality of DUT input and output terminals, said DUT producing DUT output signals at said DUT output terminals in response to DUT input signal received at said DUT input terminals, the IC tester comprising:

a plurality of first tester channels, each connected to a corresponding one of said DUT input terminals and being programmed by input first programming data to supply a time-varying test signal to the corresponding DUT input terminal during said test in response to input first control data;

a plurality of second tester channels, each connected to a corresponding one of said DUT output terminals and being programmed by input second programming data to produce a data sequence representing a time-varying behavior of a DUT output signal transmitted from the corresponding DUT output terminal in response to input second control data; and an amorphous logic circuit (ALC) having a plurality of input ALC terminals, a plurality of output ALC terminals, and a plurality of logic gates interconnected between said ALC input and output terminals in a manner determined by input third programming data, said logic gates receiving said ALC input data and producing said ALC output data in logical response to said ALC input data in accordance with the manner in which they are interconnected, wherein said ALC input terminals receive the data sequence produced by each of said second channels as ALC input data, wherein said ALC produces ALC output data at said ALC output terminals in logical response to the sample data sequences supplied to its input terminals, and wherein at least one of said ALC output terminals is connected to said first and second tester channels for delivering ALC output data as said input first and second control data.

10. The IC tester in accordance with claim 9 further comprising:

a computer for producing said first, second and third programming data as output prior to said test, and bus means for conveying said first programming data to said first tester channels, said second programming data to said second tester channels, and said third programming data to said ALC.

11. The IC tester in accordance with claim 9 wherein at least a portion of said ALC output data represents a characteristic of at least one of said DUT output signals.

12. The IC tester in accordance with claim 9 further comprising memory means connected to ones of said ALC output and input terminals for receiving and storing ALC output data provided at said ALC output terminals and for reading out stored data and providing it as ALC input data at said ALC input terminals.

13. The IC tester in accordance with claim 9 further comprising:

hardware data processing means for receiving and processing ALC output data to produce ALC input data, and connector means for receiving and holding said hardware data processing means, for connecting said hardware data processing means to ones of said ALC input and output terminals and for delivering ALC output data from said ALC to said hardware data processing means and for delivering ALC input data from said hardware data processing means to said ALC.

14. The IC tester in accordance with claim 9 further comprising:

data generating means for generating a data sequence, and connector means for receiving and holding said data generation means, for connecting said data generating means to ones of said ALC input terminals and for delivering said data sequence as ALC input data to said ALC.

15. An integrated circuit (IC) tester for performing a test on an IC device under test (DUT), the DUT having a plurality of DUT input and output terminals, said DUT producing DUT output signals at said DUT output terminals in response to DUT input signal received at said DUT input terminals, the IC tester comprising:

a plurality of first tester channels, each connected to a corresponding one of said DUT input terminals and being programmed by input first programming data to supply a time-varying test signal to the corresponding DUT input terminal during said test in response to input first control data;

a plurality of second tester channels, each connected to a corresponding one of said DUT output terminals and being programmed by input second programming data to produce a data sequence representing a time-varying behavior of a DUT output signal transmitted from the corresponding DUT output terminal in response to input second control data; and an amorphous logic circuit (ALC) having a plurality of input ALC terminals, a plurality of output ALC terminals, and a plurality of logic gates interconnected between said ALC input and output terminals in a manner determined by input third programming data, said logic gates receiving said ALC input data and producing said ALC output data in logical response to said ALC input data in accordance with the manner in which they are interconnected, wherein said ALC input terminals receive the data sequence produced by each of said second channels as ALC input data, wherein said ALC produces ALC output data at said ALC output terminals in logical response to the sample data sequences supplied to its input terminals, and wherein at least one of said ALC output terminals is connected to said first and second tester channels for delivering ALC output data as said input first and second control data;

a computer for producing said first, second and third programming data as output prior to said test; and bus means for conveying said first programming data to said first tester channels, for conveying said second programming data to said second tester channels, for conveying said third programming data to said ALC and for conveying at least a portion of said ALC output data representing a characteristic of at least one of said DUT output signals to said computer.

16. The IC tester in accordance with claim 15 further comprising memory means connected to ones of said ALC output and input terminals for receiving and storing ALC output data produced at said ALC output terminals and for reading out stored data and providing at said ALC input terminals as ALC input data.

17. The IC tester in accordance with claim 16 further comprising:

hardware data processing means for receiving and processing ALC output data to produce ALC input data, and connector means for receiving and holding said hardware data processing means, for connecting said hardware data processing means to ones of said ALC input and output terminals and for delivering ALC output data from said ALC to said hardware data processing means and for delivering ALC input data from said hardware data processing means to said ALC.

18. The IC tester in accordance with claim 16 further comprising:

data generating means for generating a data sequence, and connector means for receiving and holding said data generation means, for connecting said data generating means to ones of said ALC input terminals and for delivering said data sequence as ALC input data to said ALC.

* * * * *